United States Patent
He et al.

(10) Patent No.: US 11,287,470 B2
(45) Date of Patent: Mar. 29, 2022

(54) VECTOR-VALUED REGULARIZED KERNEL FUNCTION APPROXIMATION BASED FAULT DIAGNOSIS METHOD FOR ANALOG CIRCUIT

(71) Applicant: HEFEI UNIVERSITY OF TECHNOLOGY, Anhui (CN)

(72) Inventors: Yigang He, Anhui (CN); Wei He, Anhui (CN); Baiqiang Yin, Anhui (CN); Bing Li, Anhui (CN); Zhigang Li, Anhui (CN); Lei Zuo, Anhui (CN); Chaolong Zhang, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 299 days.

(21) Appl. No.: 16/497,444

(22) PCT Filed: Dec. 7, 2017

(86) PCT No.: PCT/CN2017/114969
§ 371 (c)(1),
(2) Date: Sep. 25, 2019

(87) PCT Pub. No.: WO2019/090878
PCT Pub. Date: May 16, 2019

(65) Prior Publication Data
US 2021/0293881 A1    Sep. 23, 2021

(30) Foreign Application Priority Data
Nov. 9, 2017   (CN) .......................... 201711097329.4

(51) Int. Cl.
*G01R 31/3163* (2006.01)
*G01R 31/28* (2006.01)
(Continued)

(52) U.S. Cl.
CPC ....... *G01R 31/3163* (2013.01); *G01R 31/287* (2013.01); *G01R 31/2884* (2013.01); *G06F 17/17* (2013.01); *G06N 7/043* (2013.01)

(58) Field of Classification Search
None
See application file for complete search history.

(56) References Cited

U.S. PATENT DOCUMENTS

| 8,175,995 B2* | 5/2012 | Amin ...................... G06N 10/00 706/45 |
| 10,776,232 B2* | 9/2020 | He ....................... G06N 3/0454 |

(Continued)

FOREIGN PATENT DOCUMENTS

| CN | 101221213 | 7/2008 |
| CN | 104198924 | 12/2014 |

(Continued)

OTHER PUBLICATIONS

"International Search Report (Form PCT/ISA/210) of PCT/CN2017/114969," dated Aug. 16, 2018, with English translation thereof, pp. 1-4.

*Primary Examiner* — Jermele M Hollington
(74) *Attorney, Agent, or Firm* — JCIPRNET

(57) ABSTRACT

A vector-valued regularized kernel function approximation (VVRKFA) based fault diagnosis method for an analog circuit comprises the following steps: (1) obtaining fault response voltage signals of an analog circuit; (2) performing wavelet packet transform on the collected signals, and calculating wavelet packet coefficient energy values as feature parameters; (3) optimizing regularization parameters and kernel parameters of VVRKFA by using a quantum particle swarm optimization algorithm and training a fault diagnosis model; and (4) identifying a circuit fault by using the trained diagnosis model. In the invention, the classification performance of the VVRKFA method is superior to (Continued)

other classification algorithms, and optimization of parameters by the quantum particle swarm optimization (QPSO) algorithm is also superior to the traditional method of obtaining parameters. The fault diagnosis method provided by the invention can efficiently diagnose the component faults of the circuit, including soft faults and hard faults.

3 Claims, 3 Drawing Sheets

(51) Int. Cl.
*G06F 17/17* (2006.01)
*G06N 7/04* (2006.01)

(56) References Cited

U.S. PATENT DOCUMENTS

| | | | |
|---|---|---|---|
| 11,124,317 B2* | 9/2021 | Zhang | G06N 20/10 |
| 2010/0094784 A1* | 4/2010 | Varma | G06N 20/00 |
| | | | 706/12 |
| 2013/0097108 A1* | 4/2013 | Niculescu-Mizil | G06N 20/00 |
| | | | 706/12 |
| 2016/0267216 A1 | 9/2016 | Goel et al. | |
| 2020/0271720 A1* | 8/2020 | He | G06N 20/00 |

FOREIGN PATENT DOCUMENTS

| | | | | | |
|---|---|---|---|---|---|
| CN | 105548862 | * | 5/2016 | ............ | G01R 31/316 |
| WO | WO-2017128455 A1 | * | 8/2017 | ............ | G01R 31/316 |
| WO | WO-2019090878 A1 | * | 5/2019 | ............ | G01R 31/316 |

* cited by examiner

VECTOR-VALUED REGULARIZED KERNEL FUNCTION APPROXIMATION BASED FAULT DIAGNOSIS METHOD FOR ANALOG CIRCUIT

CROSS-REFERENCE TO RELATED APPLICATION

This application is a 371 of international application of PCT application serial no. PCT/CN2017/114969, filed on Dec. 7, 2017, which claims the priority benefit of China application no. 201711097329.4, filed on Nov. 9, 2017. The entirety of each of the above mentioned patent applications is hereby incorporated by reference herein and made a part of this specification.

BACKGROUND OF THE INVENTION

1. Technical Field

The invention relates to the technical field of fault diagnosis of analog circuits and in particular to a vector-valued regularized kernel function approximation (VVRKFA)-based fault diagnosis method for an analog circuit.

2. Description of Related Art

With the development of integrated circuit technology, large-scale digital-analog hybrid integrated circuits are widely used in the fields of consumer electronics, industrial control and aerospace. Once they fail, it will affect the performance and functionality of devices, and even lead to catastrophic consequences. According to the data, although the analog part only accounts for 5% of an integrated circuit chip, its fault diagnosis and testing cost accounts for 95% of the total cost. Therefore, it is extremely necessary to carry out research on fault diagnosis and testing techniques of analog circuits.

At the present stage, many scholars have used the Artificial Neural Network (ANN), a Support Vector Machine (SVM) and the like to diagnose faults of analog circuits. However, the ANN method has problems such as slow learning speed and high possibility of falling into local optimal solution and overtraining, and is difficult to get adapted to the real-time requirements of diagnosis. Based on the principle of minimum structural risk, the SVM can solve small samples and nonlinear problems in classification, but it is difficult to achieve the optimal classification ability when faced with unbalanced data sets and large samples.

BRIEF SUMMARY OF THE INVENTION

The technical problem to be solved by the invention is to overcome the above-mentioned drawbacks existing in the prior art, and to provide a vector-valued regularized kernel function approximation (VVRKFA)-based fault diagnosis method for an analog circuit with high diagnosis speed and high accuracy.

According to the invention, a time domain response signal of a tested circuit is collected firstly for wavelet packet decomposition; the energy value of each node is then calculated as a sample feature parameter; QPSO is used to optimize regularization parameters and kernel parameters of a VVRKFA model and a VVRKFA-based fault diagnosis model is constructed; finally, test data is input into the model to identify a fault class.

The invention first proposes to introduce VVRKFA into the fault diagnosis of analog circuits. In the invention, a fault diagnosis classifier is constructed by applying VVRKFA to locate a fault. When VVRKFA is used to distinguish fault types, its regularization parameters and nuclear parameters need to be selected to achieve the best classification performance. Identifying a fault by using VVRKFA results in higher fault diagnosis accuracy than other existing methods. Moreover, when dealing with large-scale data, VVRKFA only requires shorter training and testing time.

Technical solutions adopted by the invention to solve its technical problem are as follows:

A VVRKF-based fault diagnosis method for an analog circuit, comprising the following steps:

(1) extracting a time domain response voltage signal of each node of a tested analog circuit, that is, collecting output signals;

(2) performing wavelet packet decomposition on the collected output signals, and calculating the energy of each node as original sample feature data; and The original sample feature data is averagely divided into two parts: a training sample set and a test sample set;

(3) optimizing regularization parameters and kernel parameters of a VVRKFA mathematical model by using Quantum particle swarm optimization (QPSO) on the basis of the training sample set and constructing a VVRKFA-based fault diagnosis model; and (4) inputting the test sample set into the constructed VVRKFA-based fault diagnosis model to identify a circuit fault class.

Further, in Step (1), the tested analog circuit has only one input end and one output end, the input end is for inputting a sinusoidal signal, and the output end is for sampling a voltage signal.

Further, in Step (2), db10 wavelet packet transform is applied to the collected output signal (i.e., the voltage signal).

Further, in Step (3), the VVRKFA-based fault diagnosis model is constructed as follows:

(3.a) determining the type of a kernel function:

selecting a Gaussian kernel function $K(x_i,x_j)=\exp(\sigma\|x_i-x_j\|^2)$ as the kernel function of VVRKFA to establish the VVRKFA mathematical model, wherein $\sigma$ is a width factor of the Gaussian kernel function; and the VVRKFA mathematical model is as follows:

$$\text{Min } J(\Theta, b, \xi) = \frac{C}{2} tr([\Theta \ b]^T [\Theta \ b]) + \frac{1}{2}\sum_{i=1}^{m}\|\xi_i\|^2 \quad (1)$$

$$\text{s.t. } \Theta K(x_i^T, B^T)^T + b + \xi_i = Y_i,$$

$$i = 1, 2, \ldots, m;$$

where, $\Theta \in \Re^{N \times \overline{m}}$ is a regression coefficient matrix, for the purpose of mapping feature inner product space to label space; N is the number of fault classes; m is the dimension of a training sample in the training sample set; $\overline{m}$ is the dimension of the sample in a dimension-reduced sample data set after the dimension reduction of the training sample set; $b \in \Re^{N \times 1}$ is a base vector; C is a regularization parameter; $\xi_i \in \Re^{N \times 1}$ is a slack variable; a matrix $B \in \Re^{\overline{m} \times n}$ is the dimension-reduced sample data set ($\overline{m} \leq m$) after the dimension reduction of the training sample set; n is the total number of all training samples in the training sample set; $K(.,.)$ is a kernel function; $x_i$ is a training sample in the training sample set; $Y_i$ is a class label vector of a training sample $x_i$; T is a matrix transpose symbol; J is a target function name; $[\Theta\ b]=YP^T[CI+PP^T]^{-1}$, where $P=[k(A,B^T)e]^T \in \Re^{(\overline{m}+1)\times m}$; $A \in \Re^{\overline{m}\times n}$ is the training sample data set; I is a unit matrix, $Y \in \Re^{N\times m}$ is a matrix containing a number m of class label vectors of training samples;

(3.b) optimizing the VVRKFA mathematical model by using a QPSO algorithm to obtain an optimal regularization parameter and an optimal kernel parameter of the VVRKFA mathematical model;

(3.c) with the training sample $x_i$ in the training sample set as input data, constructing the following vector value mapping function on the basis of the optimal regularization parameter and optimal kernel parameter obtained in Step (3.b):

$$p(x_i) = \Theta K(x_i^T, B^T)^T + b; \quad (2)$$

where, $\Theta \in \Re^{N\times\overline{m}}$ is a regression coefficient matrix, and $B \in \Re^{\overline{m}\times n}$ is a dimension-reduced sample data set after the dimension reduction of the training sample set; K(.,.) is a kernel function; in Equation (2), the kernel function K(.,.) is the optimal kernel function obtained in Step (3.b); C is a regularization parameter, and in Equation (2), the regularization parameter C is the optimal kernel parameter obtained in Step (3.b); $b \in \Re^{N\times 1}$ is a base vector, and N is the number of fault classes; m is the dimension of a training sample in the training sample set; $\overline{m}$ is the dimension of a sample in the dimension-reduced sample data set after the dimension reduction of the training sample set; and n is the total number of all training samples in the training sample set; and (3.d) using the mapping function constructed in Step (3.c) to establish a VVRKFA decision function which is expressed as:

$$\text{Class}(x) = \arg\min_{1 \le j \le N} d_M(\hat{p}(x_t), \hat{\overline{p}}^{(j)}) | \hat{\Sigma}); \quad (3)$$

where, $x_t$ is a test sample in the test sample set; $\overline{p}^{(j)} = (1/n_j)\Sigma_{i=1}^{n_j}\hat{p}(x_i)$ is the center point of all training samples of the j-th class fault in the training sample set, $d_M$ represents a Mahalanobis distance, $x_i$ is a training sample in the training sample set, $\hat{\Sigma} = \Sigma_{j=1}^N (n_j-1)\hat{\Sigma}^{(j)}/(n-N)$ is an intra-class covariance matrix, and n is the total number of training samples in the training sample set; N is the number of fault classes; $n_j$ is the number of training samples of the j-th class fault in the training sample set; $\hat{p}(x_i)$ is a mapped projection of the training sample $x_i$ in the feature subspace; and $\hat{p}(x_t)$ is a mapped projection of the test sample $x_t$ in the feature subspace.

The establishment of the decision function indicates the completion of the construction of the VVRKFA-based fault diagnosis model.

Further, in Step (3.b), the optimizing the regularization parameters and the kernel parameters of the VVRKFA mathematical model by using a QPSO algorithm to obtain an optimal regularization parameter and an optimal kernel parameter of the VVRKFA mathematical model specifically comprises:

(3.b.1) initializing parameters of the QPSO algorithm, including species speed, position, population size, number of iterations, and optimization range, wherein each particle is a two-dimensional vector of which the first dimension is the regularization parameter of the VVRKFA mathematical model and of which the second dimension is the kernel parameter of the VVRKFA mathematical model;

(3.b.2) calculating the fitness of each particle and obtaining a global optimal individual and a local optimal individual;

(3.b.3) updating the speeds and positions of the particles; and (3.b.4) repeating Steps (3.b.2) and (3.b.3) until the maximum number of iterations is reached, and then outputting optimal parameter results (i.e., the optimal regularization parameter and the optimal kernel parameter of the VVRKFA mathematical model).

Further, in Step (4), the test sample data set is input to the fault diagnosis model to carrying out circuit fault class identification to obtain a fault class of each test sample in the test sample set and further obtain the diagnosis accuracy of each class of fault, thus completing diagnosis of the tested analog circuit.

By using the VVRKFA-based method, the invention can significantly reduce the time and space overhead while maintaining a high diagnosis accuracy, which is obviously superior to the traditional fault classification method.

Compared with the prior art, the invention has the following advantages:

(1) It is proposed for the first time to introduce VVRKFA into the fault diagnosis of analog circuits. Compared with the traditional ANN and SVM methods, VVRKFA has higher classification accuracy and less time and space overhead. (2) It is proposed to optimize the regularization parameters and kernel parameters of VVRKFA by using the QPSO algorithm. Compared with the traditional grid search method, the QPSO algorithm can obtain the optimal parameters and significantly improve the performance of VVRKFA.

DETAILED DESCRIPTION OF THE INVENTION

The invention will be further described in detail below with reference to the accompanying drawings and embodiments.

Figure 1:
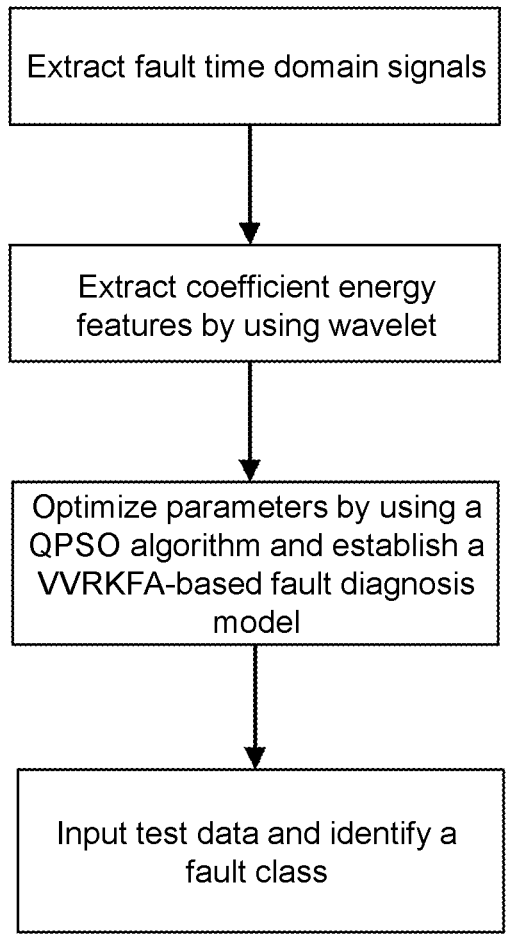
FIG. 1 is a flowchart of a VVRKFA-based fault diagnosis method for an analog circuit according to the invention.

Referring to FIG. 1, the invention comprises four steps: Step 1, a time domain response signal of a tested analog circuit is extracted. Step 2, the signal is subjected to 3-layer db10 wavelet packet decomposition, nodes in a third layer are extracted, and the energy of 8 nodes in total is used as the original sample feature data. The original sample feature data is averagely divided into two parts: a training sample set and a test sample set. Step 3, the parameters of the VVRKFA mathematical model are optimized by using the QPSO algorithm on the basis of the training sample set, and a VVRKFA-based fault diagnosis model is constructed. Step 4, the test sample set is input into the constructed VVRKFA-based fault diagnosis model to identify a circuit fault class.

In the Step 1, the time domain response signal of the tested analog circuit is obtained, and an input end is excited by a sinusoidal signal having an amplitude of 5V and a frequency of 100 Hz, and the output end samples a voltage signal.

In the Step 2, the energy of each node is calculated as follows:

In the wavelet packet analysis, the signal is projected onto the space formed by a group of mutually orthogonal wavelet basis functions; the signal is decomposed into two parts: a high frequency part and a low frequency part, and the low-frequency and high-frequency parts are simultaneously decomposed in the next layer of decomposition. The wavelet packet analysis is a more elaborate analysis method.

The wavelet packet function $\mu_{j,k}(t)$ is defined as:

$$\mu_{j,k}(t) = 2^{j/2}\mu(2^j t - k);$$

where, $j \in Z$ is the number of decomposition layers, $k \in Z$ is the number of frequency band data points, and t is a time point.

For a group of discrete signals x(t), the wavelet packet decomposition algorithm is as follows:

$$d_{j+1}^{2n} = \sum_k h(k-2t)d_j^n(k)$$

$$d_{j+1}^{2n+1} = \sum_k g(k-2t)d_j^n(k);$$

where, h(k−2t) and g(k−2t) are a low-pass filter coefficient and a high-pass filter coefficient in corresponding multi-scale analysis; $d_j^n(k)$ is a k-th wavelet decomposition coefficient point in a n-th frequency band of a j-th layer; $d_{j+1}^{2n}$ is a wavelet decomposition sequence of a 2n-th frequency band of a (j+1)-th layer; $d_{j+1}^{2n+1}$ is a wavelet decomposition sequence of a (2n+1)-th frequency band of the (j+1)-th layer; $k \in Z$ is the number of frequency band data points; t is a time point.

$d_j^n(k) = 2[\Sigma_\tau h(k-2\tau)d_{j+1}^{2n+n}(k) + \Sigma_\tau g(k-2\tau)d_{j+1}^{2n}(k)]$ indicates a k-th coefficient corresponding to the node (j, n) after wavelet packet decomposition, the node (j, n) represents a n-th frequency band of a j-th layer, and t is a translation parameter.

Then, the energy value of the wavelet packet node is calculated as follows:

$$E_i = \Sigma_{k=1}^N |d_j^n(k)|^2; i = 1, 2, \ldots, 2^j;$$

where, N is the length of a i-th frequency band; j is the number of wavelet decomposition layers; k is a sequence point of each frequency band; $d_j^n(k)$ is a k-th wavelet decomposition coefficient of the i-th frequency band of the j-th layer.

The VVRKFA fault diagnosis model is established as follows:

(3.a) determining the type of a kernel function:

selecting a Gaussian kernel function $K(x_i, x_j) = \exp(\sigma \|x_i - x_j\|^2)$ as the kernel function of VVRKFA to establish the VVRKFA mathematical model, wherein σ is a width factor of the Gaussian kernel function; and the VVRKFA mathematical model is as follows:

$$\text{Min } J(\Theta, b, \xi) = \frac{C}{2} tr([\Theta \ b]^T [\Theta \ b]) + \frac{1}{2}\sum_{i=1}^m \|\xi_i\|^2 \quad (1)$$

$$\text{s.t. } \Theta K(x_i^T, B^T)^T + b + \xi_i = Y_i,$$

$$i = 1, 2, \ldots, m;$$

where, $\Theta \in \Re^{N \times \overline{m}}$ is a regression coefficient matrix, for the purpose of mapping feature inner product space to label space; N is the number of fault classes; m is the dimension of a training sample in the training sample set; $\overline{m}$ is the dimension of the sample in a dimension-reduced sample data set after the dimension reduction of the training sample set; $b \in \Re^{N \times 1}$ is a base vector; C is a regularization parameter; $\xi_i \in \Re^{N \times 1}$ is a slack variable; the value of an element $x_j$ in the VVRKFA kernel function is a matrix B, and the matrix $B \in \Re^{\overline{m} \times n}$ is a dimension-reduced sample data set ($\overline{m} \leq m$) after the dimension reduction of the training sample set; n is the total number of all training samples in the training sample set; K(.,.) is a kernel function; $x_i$ is a training sample in the training sample set; $Y_i$ is a class label vector of the training sample $x_i$; T is a matrix transpose symbol; J is a target function name; $[\Theta \ b] = YP^T [CI + PP^T]^{-1}$, where $P = [k(A, B^T)e]^T \in \Re^{(\overline{m}+1) \times m}$; $A \in \Re^{m \times n}$ is a training sample data set; I is a unit matrix, and $Y \in \Re^{N \times m}$ is a matrix containing a number m of class label vectors of training samples;

(3.b) optimizing the VVRKFA mathematical model by using a QPSO algorithm to obtain an optimal regularization parameter and an optimal kernel parameter of the VVRKFA mathematical model;

(3.c) with the training sample $x_i$ in the training sample set as input data, constructing the following vector value mapping function on the basis of the optimal regularization parameter and the optimal kernel parameter obtained in Step (3.b):

$$p(x_i) = \Theta K(x_i^T, B^T)^T + b; \quad (2)$$

where, $\Theta \in \Re^{N \times \overline{m}}$ is a regression coefficient matrix, and $B \in \Re^{\overline{m} \times n}$ is a dimension-reduced sample data set after the dimension reduction of the training sample set; K(.,.) is a kernel function; in Equation (2), the kernel function K(.,.) is the optimal kernel function obtained in Step (3.b); C is a regularization parameter, and in Equation (2), the regularization parameter C is the optimal kernel parameter obtained in Step (3.b); $b \in \Re^{N \times 1}$ is a base vector, and N is the number of fault classes; m is the dimension of a training sample in the training sample set; $\overline{m}$ is the dimension of a sample in the dimension-reduced sample data set after the dimension reduction of the training sample set; and n is the total number of all training samples in the training sample set; and (3.d) using the mapping function constructed in Step (3.c) to establish a VVRKFA decision function which is expressed as:

$$\text{Class}(x) = \text{argmin}_{1 \leq j \leq N} d_M(\hat{p}(x_t), \hat{p}^{(j)}) |\hat{\Sigma}); \quad (3)$$

where, $x_t$ is a test sample in the test sample set; $\overline{p}^{(j)} = (1/n_j)\Sigma_{i=1}^{n_j}\hat{p}(x_i)$ is the center point of all training samples of the j-th class fault in the training sample set, $d_M$ represents a Mahalanobis distance, $x_i$ is a training sample in the training sample set, $\hat{\Sigma} = \Sigma_{j=1}^N(n_j - 1)\hat{\Sigma}^{(j)}/(n-N)$ is an intra-class covariance matrix, and n is the total number of training samples in the training sample set; N is the number of fault classes; $n_j$ is the number of training samples of the j-th class fault in the training sample set; $\hat{p}(x_i)$ is a mapped projection of the training sample $x_i$ in the feature subspace; and $\hat{p}(x_t)$ is a mapped projection of the test sample $x_t$ in the feature subspace.

The establishment of the decision function indicates the completion of the construction of the VVRKFA-based fault diagnosis model.

The optimizing the regularization parameters and the kernel parameters of the VVRKFA mathematical model by using a QPSO algorithm to obtain an optimal regularization parameter and an optimal kernel parameter of the VVRKFA mathematical model specifically comprises:

(3.b.1) initializing parameters related to the QPSO algorithm, including number of iterations, optimization range, population size, particle position and speed, wherein each particle is a two-dimensional vector, of which the first dimension is the regularization parameter of the VVRKFA mathematical model and of which the second dimension is the kernel parameter of the VVRKFA mathematical model;

(3.b.2) calculating the fitness of each particle and obtaining a global optimal individual and a local optimal individual;

(3.b.3) updating the position of each particle according to the following update expression: and (3.b.4) repeating the steps (3.b.2) and (3.b.3) until the end of the iteration, and outputting a result.

The particle position update equation in the QPSO algorithm is:

$$X_i(t+1)=P_i'(t)\pm\alpha|\text{Mbest}_i(t+1)-X_i(t)|\times\ln(1/u);$$

in the equation, $$Mbest_i(t) = \frac{1}{N}\sum_{j=1}^{N} P_j(t-1),$$

$$P_i'(t) = P_i(t-1) + (1-\beta)P_g(t-1),$$

$$\alpha = \omega_{max} - \frac{iter}{iter_{max}} \times \omega_{min}. N$$

is a population size, Mbest is the average point of individually best itermax positions of all particles; $\omega_{max}$ is the maximum inertia weight; $\omega_{min}$ is the minimum inertia weight, $P_j$ and $P_g$ are the individually best position and globally best position of particle j respectively; X is the position of the particle; t is the current number of iterations, $\alpha$ is the compression expansion factor; u and $\beta$ are uniformly distributed random numbers in the set [0, 1]; $P_i'$ is the updated position of the particle i; and $P_i$ is the current position of the particle i.

In the Step (4), the test sample data set is input to the fault diagnosis model to carrying out circuit fault class identification to obtain a fault class of each test sample in the test sample set and further obtain the diagnosis accuracy of each class of fault, thus completing diagnosis of the tested analog circuit.

The execution process and performance of the VVRKFA-based fault diagnosis method for an analog circuit provided by the invention will be described below with an example.

Figure 2:
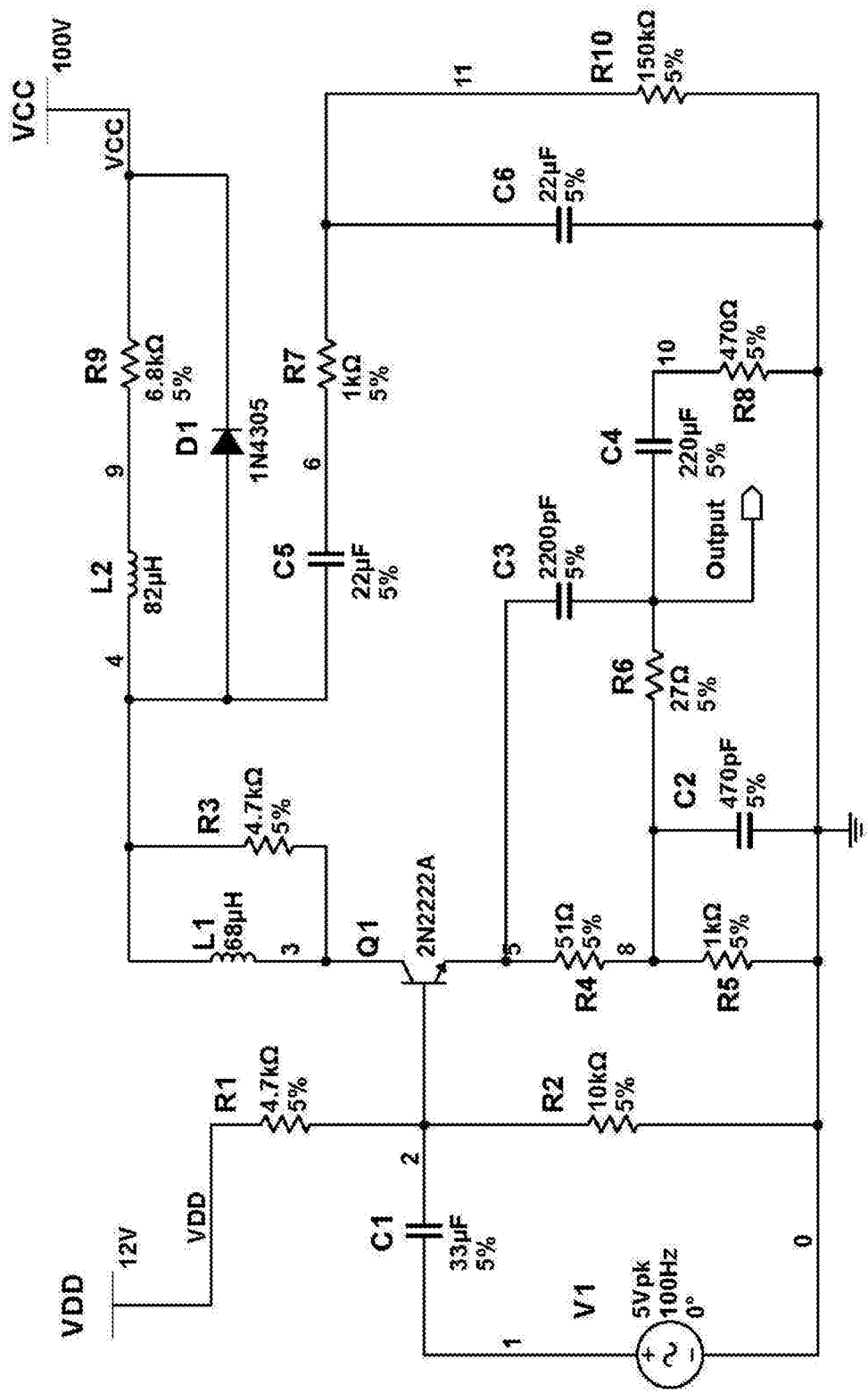
FIG. 2 is a circuit diagram of a video amplifier circuit selected in the invention.

FIG. 2 shows a video amplifier circuit, and the nominal values and tolerances of the components are marked in the figure. Taking the circuit as an example, the whole process of the fault diagnosis method provided by the invention is shown. The excitation source is a sinusoidal signal with an amplitude of 5V and a frequency dimension of 100 Hz, and a fault response time domain signal is sampled at the output end of the circuit. R1, R2, R3, C4, R4, R5, R6, R8 and Q1 are selected as test objects. Table 1 and Table 2 give the fault code, nominal value and fault value of each test component, where ↑ and ↓ respectively indicate that the fault value is higher and lower than the nominal value. A fault-free situation is also considered a fault and its fault code is F0. Sixty data samples are taken for each fault class and divided into two parts. The first 30 data samples are used to establish a VVRKFA fault diagnosis model, and the last 30 data samples are used to test the performance of the fault diagnosis model.

TABLE 1

Parameter faults of video amplifier circuit

| Fault code | Fault class | Fault value | Fault code | Fault class | Fault value |
|---|---|---|---|---|---|
| F1 | R2 ↑ | 15 kΩ | F2 | R2 ↓ | 6 kΩ |
| F3 | R4 ↑ | 100Ω | F4 | R4 ↓ | 27Ω |
| F5 | R6 ↑ | 150Ω | F6 | R6 ↓ | 5Ω |
| F7 | R8 ↑ | 1 kΩ | F8 | R8 ↓ | 50Ω |

TABLE 2

Catastrophic faults of video amplifier circuit

| Fault code | Fault value | Fault code | Fault value |
|---|---|---|---|
| F9 | R1 is open-circuited. | F10 | R1 is short-circuited. |
| F11 | R3 is short-circuited. | F12 | C4 is open-circuited. |
| F13 | R5 is open-circuited. | F14 | The base is open-circuited. |
| F15 | The base-emitter is short-circuited. | F16 | The collector is open-circuited. |

Figure 3:
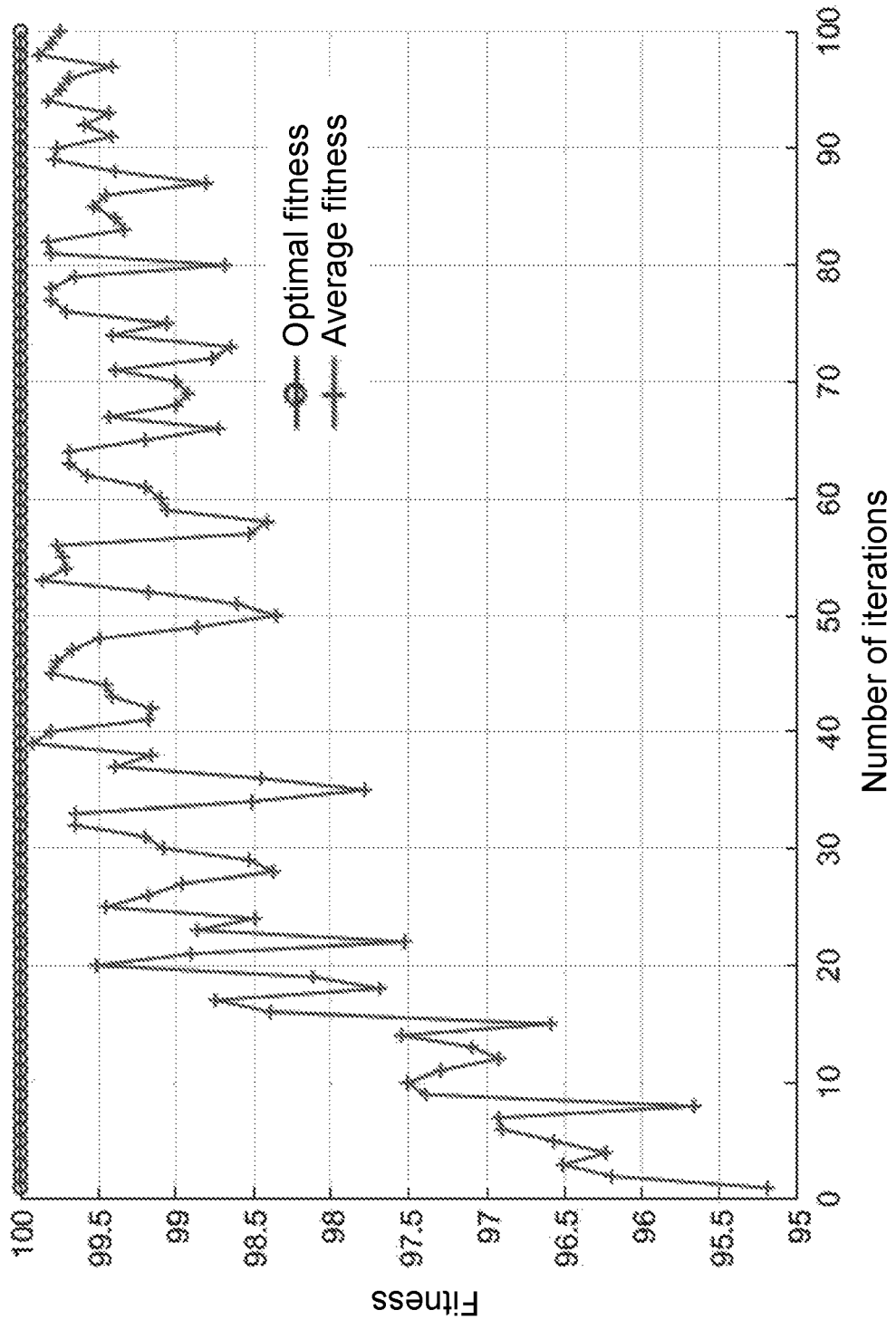
FIG. 3 shows a training process of optimizing the parameters of the VVRKFA method.

In the QPSO algorithm, the population size and the number of iterations are set to 10 and 100, respectively, the maximum inertia weight is set to 1, and the minimum inertia weight is 0.5. In the simulation, the regularization parameter and the kernel width factor obtained by the optimization are $1.0076\times10^{-4}$ and 1.0095, respectively. The training process of QPSO optimizing VVRKFA is shown in FIG. 3. The optimal regularization parameter and kernel width factor obtained by optimization are used to construct a VVRKFA-based fault diagnosis model, and the test data is input for fault identification. The diagnosis results are shown in Table 3. The GMKL-SVM fault diagnosis model after parameter selection by the PSO algorithm correctly identifies all faults F0, F1, F3, F4, F7, F8, F11, F11, F12, F13, F14, F15 and F14; two F2 faults are erroneously identified as F5 faults, one F5 fault is erroneously identified as an F3 fault, and one F6 fault is erroneously identified as an F0 fault. It can be considered that the VVRKFA fault diagnosis model after the regularization parameters and the kernel width factors are optimized by the QPSO algorithm has achieved good diagnosis results in fault diagnosis. After calculation, the overall diagnosis accuracy for the faults of the analog circuit can reach 98.82%.

TABLE 3

Diagnosis results for fault classes

| | F0 | F1 | F2 | F3 | F4 | F5 | F6 | F7 | F8 | F9 | F10 | F11 | F12 | F13 | F14 | F15 | F16 |
|---|---|---|---|---|---|---|---|---|---|---|---|---|---|---|---|---|---|
| F0 | 30 | | | | | | | | | | | | | | | | |
| F1 | | 30 | | | | | | | | | | | | | | | |

TABLE 3-continued

Diagnosis results for fault classes

|    | F0 | F1 | F2 | F3 | F4 | F5 | F6 | F7 | F8 | F9 | F10 | F11 | F12 | F13 | F14 | F15 | F16 |
|----|----|----|----|----|----|----|----|----|----|----|-----|-----|-----|-----|-----|-----|-----|
| F2 |    |    | 28 |    |    | 2  |    |    |    |    |     |     |     |     |     |     |     |
| F3 |    |    |    | 30 |    |    |    |    |    |    |     |     |     |     |     |     |     |
| F4 |    |    |    |    | 30 |    |    |    |    |    |     |     |     |     |     |     |     |
| F5 |    |    |    | 1  |    | 29 |    |    |    |    |     |     |     |     |     |     |     |
| F6 | 1  |    |    |    |    |    | 29 |    |    |    |     |     |     |     |     |     |     |
| F7 |    |    |    |    |    |    |    | 30 |    |    |     |     |     |     |     |     |     |
| F8 |    |    |    |    |    |    |    |    | 30 |    |     |     |     |     |     |     |     |
| F9 |    |    |    |    |    |    |    |    |    | 30 |     |     |     |     |     |     |     |
| F10|    |    |    |    |    |    |    |    |    |    | 30  |     |     |     |     |     |     |
| F11|    |    |    |    |    |    |    |    |    |    |     | 30  |     |     |     |     |     |
| F12|    |    |    |    |    |    |    |    |    |    |     |     | 30  |     |     |     |     |
| F13|    |    |    |    |    |    |    |    |    |    |     |     |     | 30  |     |     |     |
| F14|    |    |    |    |    |    |    |    |    |    |     |     |     |     | 30  |     |     |
| F15|    |    |    |    |    |    |    |    |    |    |     |     |     |     |     | 30  |     |
| F16|    |    |    |    |    |    |    |    |    |    |     |     |     |     |     |     | 30  |

What is claimed is:

1. A vector-valued regularized kernel function approximation (VVRKFA) based fault diagnosis method for an analog circuit, comprising the following steps:

(1) extracting a time domain response voltage signal of each node of a tested analog circuit, that is, collecting output signals;

(2) performing wavelet packet decomposition on the collected output signals, and calculating energy of each node as original sample feature data; and averagely dividing the original sample feature data into two parts: a training sample set and a test sample set;

(3) optimizing regularization parameters and kernel parameters of a VVRKFA mathematical model by using Quantum Particle Swarm Optimization (QPSO) on the basis of the training sample set and constructing a VVRKFA-based fault diagnosis model; and (4) inputting the test sample set into the constructed VVRKFA-based fault diagnosis model to identify a circuit fault class;

wherein in Step (3), the VVRKFA-based fault diagnosis model is constructed as follows:

(3.a) determining a type of a kernel function:

selecting a Gaussian kernel function $K(x_i, x_j) = \exp(\sigma \|x_i - x_j\|^2)$ as the kernel function of VVRKFA to establish the VVRKFA mathematical model, wherein $\sigma$ is a width factor of the Gaussian kernel function; and the VVRKFA mathematical model is as follows:

$$\text{Min } J(\Theta, b, \xi) = \frac{C}{2} tr([\Theta \ b]^T [\Theta \ b]) + \frac{1}{2} \sum_{i=1}^{m} \|\xi_i\|^2 \quad (1)$$

$$\text{s.t. } \Theta K(x_i^T, B^T)^T + b + \xi_i = Y_i,$$

$$i = 1, 2, \ldots, m;$$

where, $\Theta \in \Re^{N \times \bar{m}}$ is a regression coefficient matrix, for the purpose of mapping feature inner product space to label space; N is a number of fault classes; m is a dimension of a training sample in the training sample set; $\bar{m}$ is the dimension of the sample in a dimension-reduced sample data set after a dimension reduction of the training sample set; $b \in \Re^{N \times 1}$ is a base vector; C is a regularization parameter;

$\xi_i \in \Re^{N \times 1}$ is a slack variable; a matrix $B \in \Re^{\bar{m} \times n}$ is the dimension-reduced sample data set ($\bar{m} \leq m$) after the dimension reduction of the training sample set; n is a total number of all training samples in the training sample set; $K(.,.)$ is a kernel function;

$x_i$ is a training sample in the training sample set; $Y_i$ a is a class label vector of the training sample $x_i$; T is a matrix transpose symbol; J is a target function name; $[\Theta \ b] = YP^T[CI + PP^T]^{-1}$, where $P = [k(A, B^T)e]^T \in \Re^{(\bar{m}+1) \times m}$; $A \in \Re^{m \times n}$ is a training sample data set; I is a unit matrix, and $Y \in \Re^{N \times m}$ is a matrix containing a number m of class label vectors of training samples;

(3.b) optimizing the VVRKFA mathematical model by using the QPSO algorithm to obtain an optimal regularization parameter and an optimal kernel parameter of the VVRKFA mathematical model;

(3.c) with the training sample $x_i$ in the training sample set as input data, constructing the following vector value mapping function on the basis of the optimal regularization parameter and the optimal kernel parameter obtained in Step (3.b):

$$p(x_i) = \Theta K(x_i^T, B^T)^T + b; \quad (2)$$

where, $\Theta \in \Re^{N \times \bar{m}}$ is a regression coefficient matrix, and $B \in \Re^{\bar{m} \times n}$ is a dimension-reduced sample data set after dimension reduction of the training sample set; K (.,.) is a kernel function; in Equation (2), the kernel function K (.,.) is the optimal kernel function obtained in Step (3.b); C is the regularization parameter, and in Equation (2), the regularization parameter C is the optimal kernel parameter obtained in Step (3.b); $b \in \Re^{N \times 1}$ is a base vector, and N is the number of fault classes; m is the dimension of a training sample in the training sample set; $\bar{m}$ is the dimension of a sample in the dimension-reduced sample data set after the dimension reduction of the training sample set; and n is the total number of all training samples in the training sample set; and (3.d) using the mapping function constructed in Step (3.c) to establish a VVRKFA decision function which is expressed as:

$$\text{Class}(x) = \text{argmin}_{1 \leq j \leq N} d_M(p(x_t), \bar{p}^{(j)}) | \hat{\Sigma}); \quad (3)$$

where, $x_t$ is a test sample in the test sample set; $\bar{p}^{(j)} = (1/n_j) \hat{\Sigma}_{i=1}^{n_j} \hat{p}(x_i)$, is the center point of all training samples of the j-th class fault in the training sample set, $d_M$ represents a Mahalanobis distance, $x_i$ is a training sample in the training sample set, $\hat{\Sigma} = \Sigma_{j=1}^{N} (n_j - 1) \hat{\Sigma}^{(j)} / (n - N)$ is an intra-class covariance matrix, and n is the total number of training samples in the training sample set; N is the number of fault classes; $n_j$ is the number of training samples of the j-th class fault in the training sample set; $\hat{p}(x_i)$ is a mapped projection of the training sample $x_i$ in the feature subspace; and $\hat{p}(x_j)$ is a mapped projection of the test sample in the feature subspace;

wherein the establishment of the decision function indicates the completion of the construction of the VVRKFA-based fault diagnosis model.

2. The VVRKFA-based fault diagnosis method for an analog circuit according to claim 1, wherein in Step (3.b), the optimizing the regularization parameters and the kernel parameters of the VVRKFA mathematical model by using the QPSO algorithm to obtain an optimal regularization parameter and an optimal kernel parameter of the VVRKFA mathematical model specifically comprises:

(3.b.1) initializing parameters of the QPSO algorithm, including species speed, position, population size, number of iterations, and optimization range, wherein each particle is a two-dimensional vector of which a first dimension is a regularization parameter of the VVRKFA mathematical model and of which a second dimension is a kernel parameter of the VVRKFA mathematical model;

(3.b.2) calculating the fitness of each particle and obtaining a global optimal individual and a local optimal individual;

(3.b.3) updating the speeds and positions of the particles; and (3.b.4) repeating steps (3.b.2) and (3.b.3) until the maximum number of iterations is reached, and then outputting optimal parameter results (i.e., the optimal regularization parameter and the optimal kernel parameter of the VVRKFA mathematical model).

3. The VVRKFA-based fault diagnosis method for an analog circuit according to claim 1, wherein in Step (4), the test sample data set is input to the fault diagnosis model to carrying out circuit fault class identification to obtain a fault class of each test sample in the test sample set and further obtain the diagnosis accuracy of each class of fault, thus completing diagnosis of the tested analog circuit.

* * * * *